US011289385B2

(12) United States Patent
Park (10) Patent No.: US 11,289,385 B2
(45) Date of Patent: Mar. 29, 2022

(54) SEMICONDUCTOR DIE AND A METHOD FOR DETECTING AN EDGE CRACK IN A SEMICONDUCTOR DIE

(71) Applicant: Winbond Electronics Corp., Taichung (TW)

(72) Inventor: San-Ha Park, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/897,216

(22) Filed: Jun. 9, 2020

(65) Prior Publication Data
US 2021/0384085 A1    Dec. 9, 2021

(51) Int. Cl.
*H01L 21/66* (2006.01)

(52) U.S. Cl.
CPC .............. *H01L 22/12* (2013.01); *H01L 22/34* (2013.01)

(58) Field of Classification Search
CPC . H01L 22/12; H01L 22/34; G01R 31/318511; G01R 31/2884; G01R 31/2831; G01R 31/318505
See application file for complete search history.

(56) References Cited

U.S. PATENT DOCUMENTS

| 6,449,748 | B1 | 9/2002 | Jeng et al. |
| 8,803,308 | B2 | 8/2014 | Ishikawa |
| 9,287,184 | B2 | 3/2016 | Dennison et al. |
| 10,241,151 | B2 | 3/2019 | Sanchez et al. |
| 2015/0115266 | A1 | 4/2015 | Sanchez et al. |
| 2020/0150174 | A1* | 5/2020 | Kumar et al. ..... G01R 31/2884 |
| 2020/0219826 | A1* | 7/2020 | Wu et al. .............. H01L 23/562 |

FOREIGN PATENT DOCUMENTS

CN          102760728           4/2015

* cited by examiner

*Primary Examiner* — Jermele M Hollington
*Assistant Examiner* — Suresh K Rajaputra
(74) *Attorney, Agent, or Firm* — JCIPRNET (57) ABSTRACT

A semiconductor die including a crack stop structure, at least one edge seal structure and a selector circuit is provided. The crack stop structure is located in a periphery region of the semiconductor die. The crack stop structure is biased by a first voltage. The edge seal structure is located between the crack stop structure and an integrated circuit region of the semiconductor die. The edge seal structure is biased by the first voltage in a normal mode and is biased by a second voltage different from the first voltage in a test mode. The selector circuit receives the first voltage, the second voltage and a control signal for placing the semiconductor die in the normal mode or the test mode, and selects and outputs one of the first voltage and the second voltage to the edge seal structure according to the control signal.

14 Claims, 10 Drawing Sheets

SEMICONDUCTOR DIE AND A METHOD FOR DETECTING AN EDGE CRACK IN A SEMICONDUCTOR DIE

BACKGROUND

Technical Field

The invention relates to a semiconductor die and a method for detecting a crack in the semiconductor die.

Description of Related Art

Cracks in the edge of a semiconductor chip (hereafter called chip edge crack) may cause failures found by the end of customer. Chip edge crack may be caused by processes of die sawing and packaging. Recently, demand of thinner grinding is increased with increasing demand of more stacks and thinner package. Because of this trend, chip edge crack happens more frequently and seriously. For improving product quality, conventional crack detection methods are provided to screen out major chip edge crack. But it is not easy to detect minor crack by the conventional crack detection methods. However, minor crack may become serious by thermal, electrical and mechanical impact during the processes of manufacturing the semiconductor chip, thereby causing failures not being screened out. Therefore, how to effectively detect chip edge crack is an important issue in the field.

SUMMARY

The invention is directed to a semiconductor die and a method for detecting an edge crack of the semiconductor die.

An embodiment of the invention provides a semiconductor die including a crack stop structure, at least one edge seal structure and a selector circuit. The crack stop structure is located in a periphery region of the semiconductor die. The crack stop structure is biased by a first voltage. The at least one edge seal structure is located between the crack stop structure and an integrated circuit (IC) region of the semiconductor die. The at least one edge seal structure is biased by the first voltage in a normal mode and is biased by a second voltage different from the first voltage in a test mode. The selector circuit is coupled to the at least one edge seal structure. The selector circuit is configured to receive the first voltage, the second voltage and a control signal for placing the semiconductor die in the normal mode or the test mode, and select and output one of the first voltage and the second voltage to the at least one edge seal structure according to the control signal.

An embodiment of the invention provides a method for detecting an edge crack in a semiconductor die. The semiconductor die includes a crack stop structure and at least one edge seal structure. The crack stop structure is located in a periphery region of the semiconductor die and biased by a first voltage. The at least one edge seal structure is located between the crack stop structure and an integrated circuit region of the semiconductor die. The method for detecting the edge crack in the semiconductor die includes: receiving a first voltage, a second voltage and a control signal for placing the semiconductor die in a normal mode or a test mode, wherein the second voltage is different from the first voltage; outputting the first voltage to the at least one edge seal structure in the normal mode, and receiving a reference current from the crack stop structure or the at least one edge seal structure; outputting the second voltage to the at least one edge seal structure in the test mode, and receiving a test current from the crack stop structure or the at least one edge seal structure; comparing the test current to the reference current for generating a comparison result; and determining whether there is a crack in the periphery region according to the comparison result.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Reference will now be made in detail to the present exemplary embodiments of the invention, examples of which are illustrated in the accompanying drawings. Wherever possible, the same reference numbers are used in the drawings and the description to refer to the same or like parts.

Figure 1A:
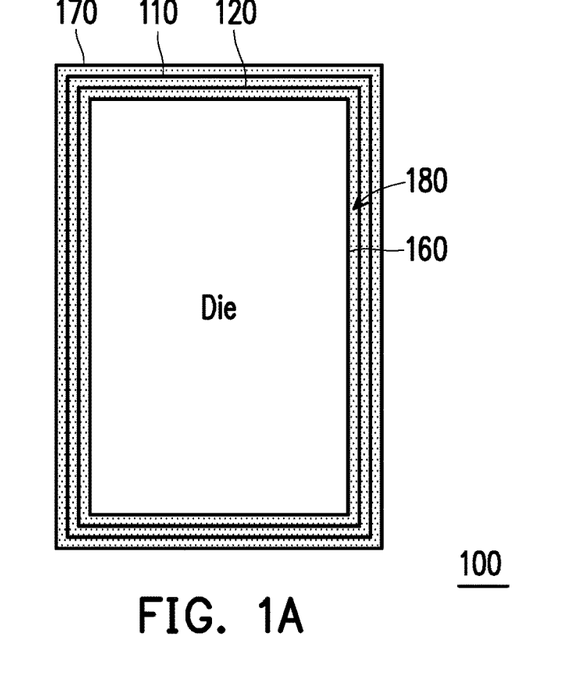
FIG. 1A and FIG. 1B illustrate a schematic diagram of a semiconductor die according to an embodiment of the invention.
Figure 1B:
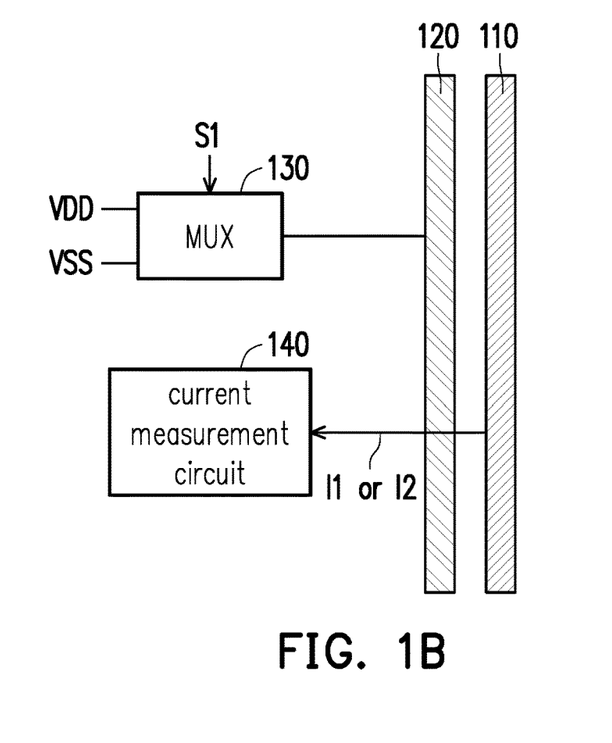
Figure 2:
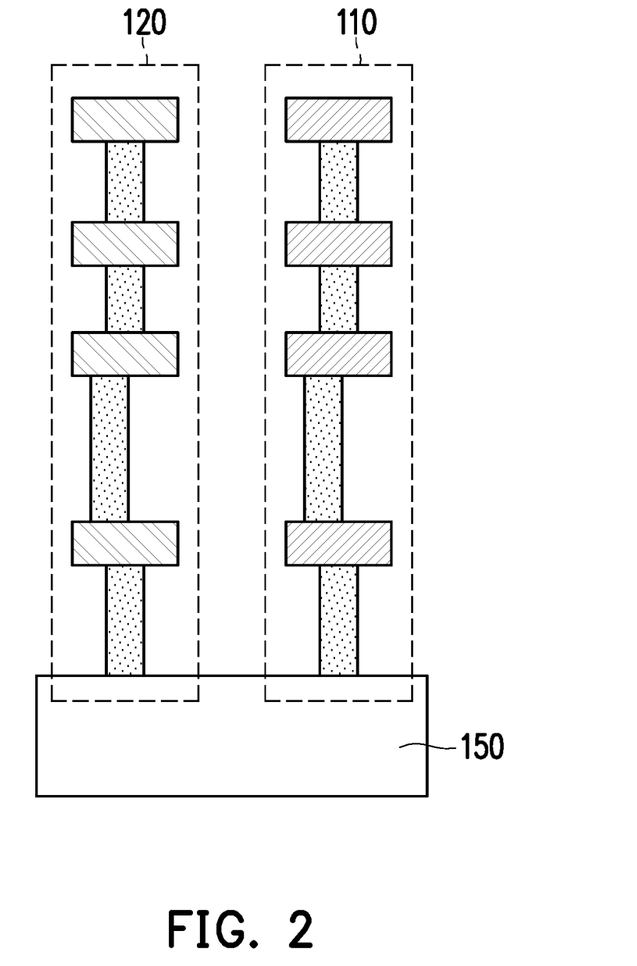
FIG. 2 illustrates a schematic diagram of a crack stop structure and at least one edge seal structure depicted in FIG. 1A.

FIG. 1A and FIG. 1B illustrate a schematic diagram of a semiconductor die according to an embodiment of the invention. FIG. 2 illustrates a schematic diagram of a crack stop structure and at least one edge seal structure depicted in FIG. 1A. Referring to FIG. 1A to FIG. 2, the semiconductor die 100 includes a crack stop structure 110, at least one edge seal structure 120, a selector circuit 130 and a current measurement circuit 140 in the present embodiment. The semiconductor die 100 includes an integrated circuit (IC) region 160 and a periphery region 180 between the die boundary 170 and the IC region 160. For example, the IC region 160 may include a memory array. The crack stop structure 110 is located in the periphery region 180. The edge seal structure 120 is located in the periphery region 180 and at an inner side of the crack stop structure 110, namely, the edge seal structure 120 is located between the crack stop structure 110 and the IC region 160. The selector circuit 130 is located in the IC region 160 and coupled to the edge seal structure 120. The current measurement circuit 140 is located in the IC region 160 and coupled to the crack stop structure 110.

The crack stop structure 110 is biased by a first voltage VSS, for example. The edge seal structure 120 is controllably biased by the first voltage VSS or a second voltage VDD. The second voltage VDD is different from the first voltage VSS. In the present embodiment, the second voltage VDD is larger than the first voltage VSS. In an embodiment, the crack stop structure 110 may be biased by the second voltage VDD, and the invention is not limited thereto. In an embodiment, the first voltage VSS may be a ground voltage, and the second voltage VDD may be an operating voltage which is provided internally or externally.

In the present embodiment, the selector circuit 130 is controlled by a control signal S1 and selects and outputs one of the first voltage VSS and the second voltage VDD to the edge seal structure 120 according to operating modes of the semiconductor die 100. The control signal S1 may be outputted from a memory controller (not shown), and the invention is not limited thereto. In the present embodiment, the selector circuit 130 includes a multiplexer for voltage selecting.

Referring to FIG. 2, the crack stop structure 110 and the edge seal structure 120 are both placed around the IC region 160. The crack stop structure 110 is configured to block crack and also block moisture penetration or chemical damage to the IC region 160. The crack stop structure 110 may include a plurality of metal structures composed of tungsten and copper alloy to form a wall around the IC region 160, and the invention is not limited thereto. The edge seal structure 120 is made of a similar structure. Therefore, the function of the edge seal structure 120 is also similar to that of the crack stop structure 110. In an embodiment, the crack stop structure 110 is fixedly applied with the first voltage VSS regardless of the operating modes. On the other hand, the edge seal structure 120 is selectively applied with the first voltage VSS or the second voltage VDD depending on the operating modes.

Figure 3:
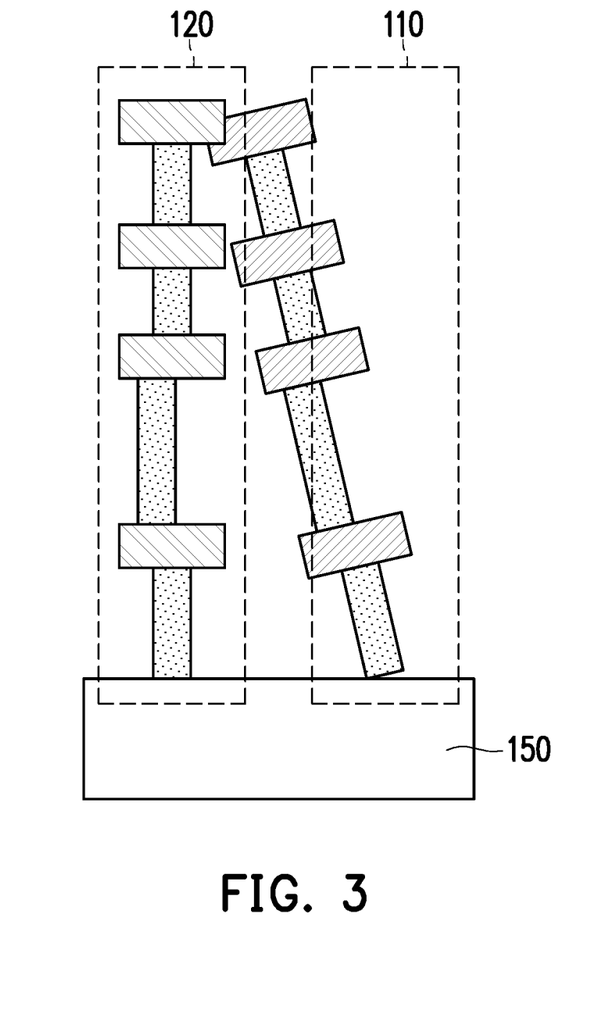
FIG. 3 and FIG. 4 respectively illustrate two different cases that a crack happens in the semiconductor die according to embodiments of the invention.
Figure 4:
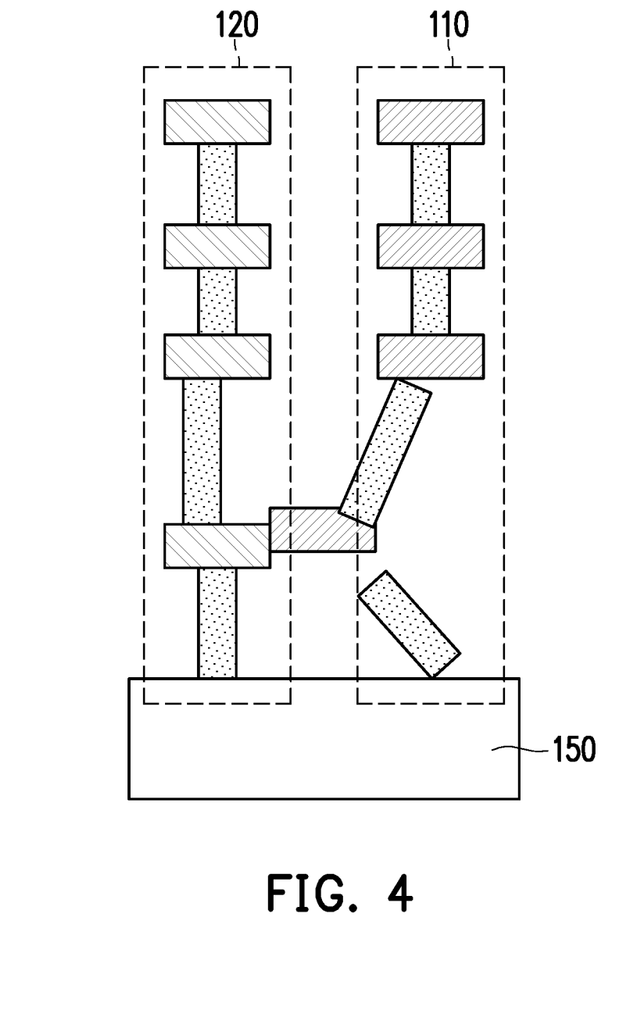

FIG. 3 and FIG. 4 respectively illustrate two different cases that a crack happens in the semiconductor die according to embodiments of the invention. In the disclosure, a method for testing the semiconductor die 100 is provided for determining whether the crack happens in the semiconductor die 100. If the crack happens, the crack stop structure 110 and the edge seal structure 120 are shorted as illustrated FIG. 3 and FIG. 4.

To be specific, to detect whether the crack happens, referring to FIG. 1A and FIG. 1B, the semiconductor die 100 performs operating modes including a test mode and a normal mode independently and sequentially. First, the semiconductor die 100 operates in the normal mode, the selector circuit 130 selects and outputs the first voltage VSS to the edge seal structure 120, such that the crack stop structure 110 and the edge seal structure 120 are both biased by the same potential (the first voltage VSS) in the normal mode. Thereafter, the current measurement circuit 140 measures a reference current I1 on the crack stop structure 110, and then record the reference current I1 in a register or a latch (not shown).

Next, the semiconductor die 100 operates in the test mode, the selector circuit 130 selects and outputs the second voltage VDD to the edge seal structure 120, such that the crack stop structure 110 and the edge seal structure 120 are respectively biased by the first voltage VSS and the second voltage VDD. Namely, the crack stop structure 110 and the edge seal structure 120 are biased by different potentials in the test mode. Thereafter, the current measurement circuit 140 measures a test current I2 on the crack stop structure 110, and then records the test current I2 in the register or the latch. The order of performing the test mode and the normal mode can be changed to perform test mode first and then perform normal mode. Therefore, there is no need to place the semiconductor die 100 back to the normal mode again.

After obtaining the reference current I1 and the test current I2, the current measurement circuit 140 compares the test current I2 to the reference current I1 to generate a comparison result. The current measurement circuit 140 determines whether the crack stop structure 110 and the edge seal structure 120 are shorted according to the comparison result. For example, if the comparison result shows that the test current I2 is larger than the reference current I1, i.e. current increases after changing to the test mode, the current measurement circuit 140 determines that the crack stop structure 110 and the edge seal structure 120 are shorted, which means the crack happens in the periphery region 180 of the semiconductor die 100 as illustrated FIG. 3 and FIG. 4.

If the comparison result shows that the test current I2 is not larger than the reference current I1, the current measurement circuit 140 determines that the crack stop structure 110 and the edge seal structure 120 are not shorted, which means there is no crack in the periphery region 180 of the semiconductor die 100 as illustrated FIG. 2. In an embodiment, the comparison result may show that the test current I2 is substantially equal to the reference current I1, for example, the test current I2 is not larger than 1.05 times of the reference current I1, it also means the crack does not happen in the semiconductor die 100.

Regarding hardware structures of the components in the embodiment of FIG. 1B, the current measurement circuit 140 may be designed through hardware description languages (HDL) or any other design methods for digital circuits familiar to people skilled in the art and may be hardware circuits implemented through a field programmable gate array (FPGA), a complex programmable logic device (CPLD), or an application-specific integrated circuit (ASIC). In addition, enough teaching, suggestion, and implementation illustration for hardware structures of the current measurement circuit 140 can be obtained with reference to common knowledge in the related art, which is not repeated hereinafter.

Figure 1C:
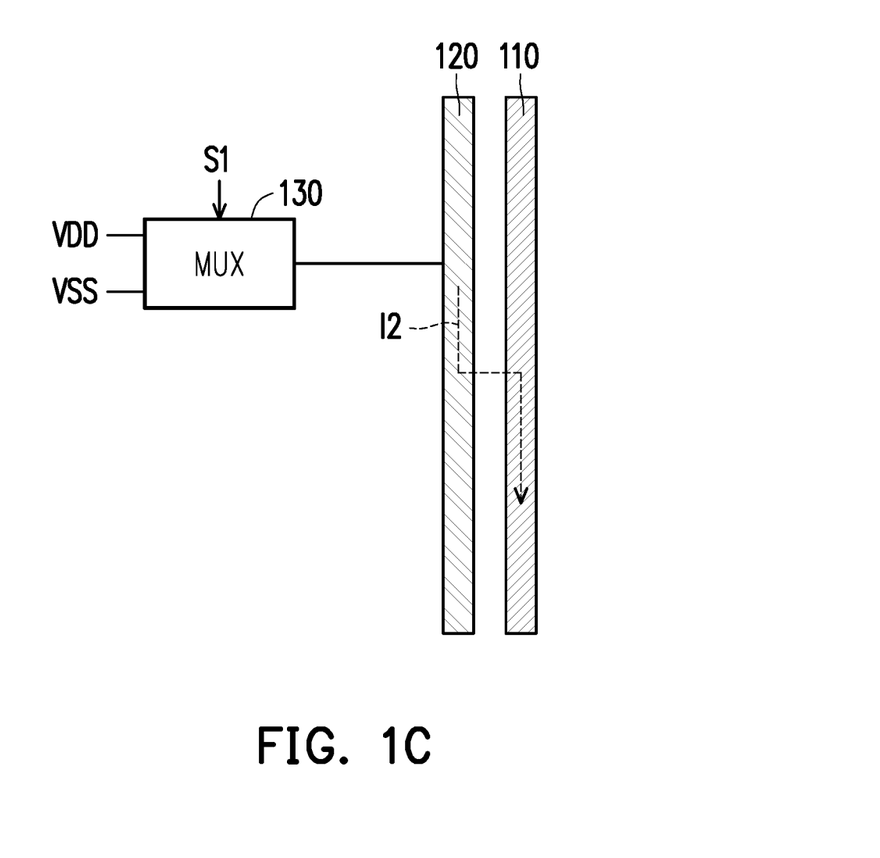
FIG. 1C illustrates a schematic diagram of a semiconductor die according to another embodiment of the invention.

FIG. 1C illustrates a schematic diagram of a semiconductor die according to another embodiment of the invention. Referring to FIG. 1A and FIG. 1C, in the present embodiment, whether the crack stop structure 110 and the edge seal structure 120 are shorted or not can be determined by a tester (not shown) connected to the crack stop structure 110. In the test mode, the crack stop structure 110 is biased by the first voltage VSS, and the selector circuit 130 selects and outputs the second voltage VDD to bias the edge seal structure 120. Therefore, the crack stop structure 110 and the edge seal structure 120 are biased by different potentials in the test mode. If the crack happens, the test current I2 may be transmitted from the edge seal structure 120 to the tester via the crack stop structure 110.

If the test current I2 is larger than a reference current stored in the tester, the tester determines that the crack stop structure 110 and the edge seal structure 120 are shorted, which means the crack happens in the periphery region 180 of the semiconductor die 100 as illustrated FIG. 3 and FIG. 4. If the test current I2 is not larger than the reference current, the tester determines that the crack stop structure 110 and the edge seal structure 120 are not shorted, which means there is no crack in the periphery region 180 of the semiconductor die 100 as illustrated FIG. 2. The reference current may be the reference current I1 that is measured by the tester in the normal mode or a predetermined reference current set by users.

Figure 5A:
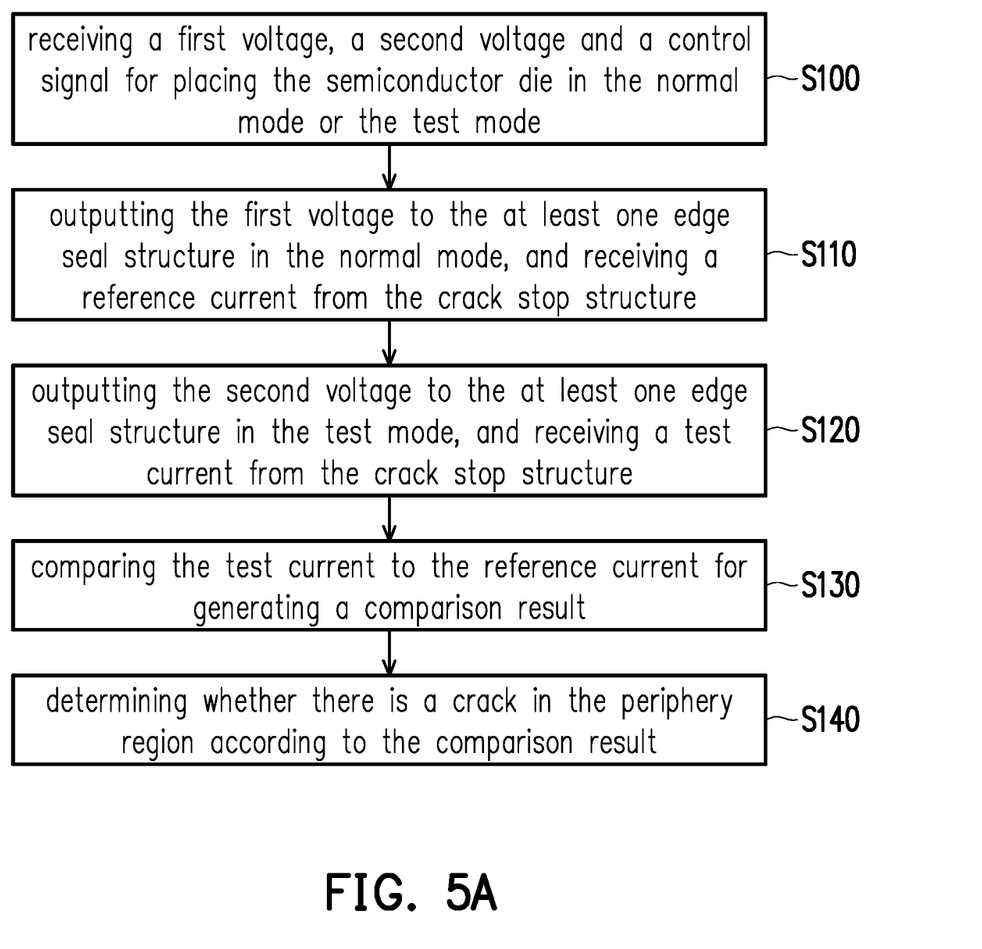
FIG. 5A is a flowchart illustrating steps in a method for detecting an edge crack in a semiconductor die according to another embodiment of the invention.

FIG. 5A is a flowchart illustrating steps in a method for detecting an edge crack in a semiconductor die according to another embodiment of the invention. Referring to FIG. 5A, the method for testing the semiconductor die of the embodiment is at least adapted to the semiconductor die 100 of FIGS. 1A and 1B, but the invention is not limited thereto. Taking the semiconductor die 100 for example, in step S100, the selector circuit 130 receives a first voltage VSS, a second voltage VDD and a control signal S1 for placing the semiconductor die 100 in the normal mode or the test mode. The second voltage VDD is different from the first voltage VSS. In step S110, the selector circuit 130 outputs the first voltage VSS to the at least one edge seal structure 120 in the normal mode, and the current measurement circuit 140 receives a reference current I1 from the crack stop structure 110. In step S120, the selector circuit 130 outputs the second voltage VDD to the at least one edge seal structure 120 in the test mode, and the current measurement circuit 140 receives a test current I2 from the crack stop structure 110. In step S130, the current measurement circuit 140 compares the test current I2 to the reference current I1 for generating a comparison result. In step S140, the current measurement circuit 140 determines whether there is a crack in the periphery region 180 according to the comparison result.

In addition, sufficient teaching, suggestion, and implementation illustration regarding the method for detecting an edge crack in a semiconductor die of the embodiments of the invention may be obtained from the foregoing embodiments of FIG. 1 to FIG. 4, and thus related description thereof is not repeated hereinafter.

Figure 5B:
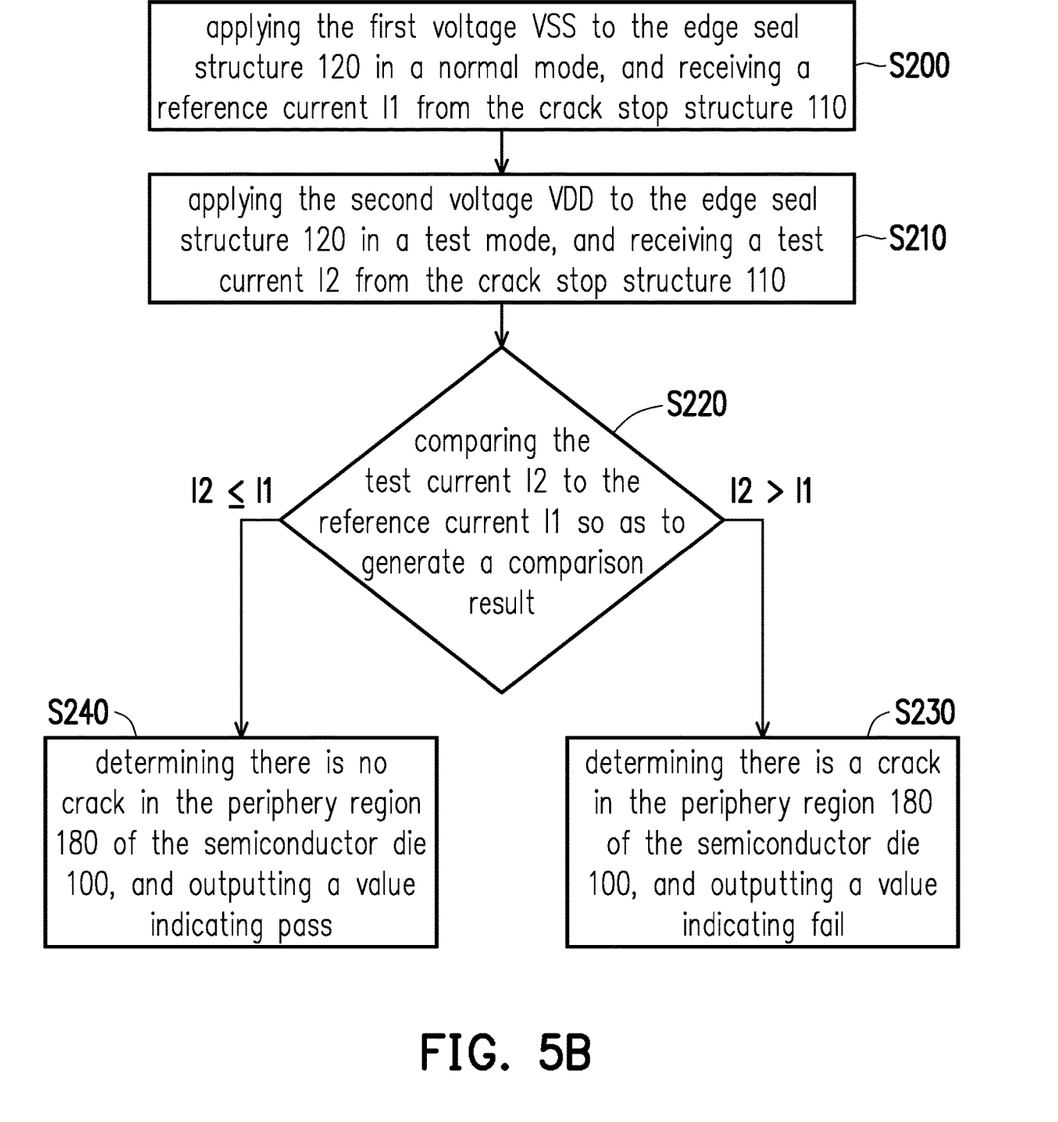
FIG. 5B is a flowchart illustrating steps in a method for detecting an edge crack in a semiconductor die according to another embodiment of the invention.

FIG. 5B is a flowchart illustrating steps in a method for detecting an edge crack in a semiconductor die according to another embodiment of the invention. Referring to FIG. 5B, the method for testing the semiconductor die of the embodiment is at least adapted to the semiconductor die 100 of FIGS. 1A and 1B, but the invention is not limited thereto. Taking the semiconductor die 100 for example, in step S200, the selector circuit 130 applies the first voltage VSS to the edge seal structure 120 in a normal mode, and the current measurement circuit 140 receives a reference current I1 from the crack stop structure 110. In step S210, the selector circuit 130 applies the second voltage VDD to the edge seal structure 120 in a test mode, and the current measurement circuit 140 receives a test current I2 from the crack stop structure 110. In step S220, the current measurement circuit 140 compares the test current I2 to the reference current I1 so as to generate a comparison result. If the comparison result shows that the test current I2 is larger than the reference current I1, in step S230, the current measurement circuit 140 determines there is a crack in the periphery region 180 of the semiconductor die 100, and output a value indicating fail. If the comparison result shows that the test current I2 is less than or equal to the reference current I1, in step S240, the current measurement circuit 140 determines there is no crack in the periphery region 180 of the semiconductor die 100, and output a value indicating pass.

In addition, sufficient teaching, suggestion, and implementation illustration regarding the method for detecting an edge crack in a semiconductor die of the embodiments of the invention may be obtained from the foregoing embodiments of FIG. 1 to FIG. 4, and thus related description thereof is not repeated hereinafter.

Figure 6A:
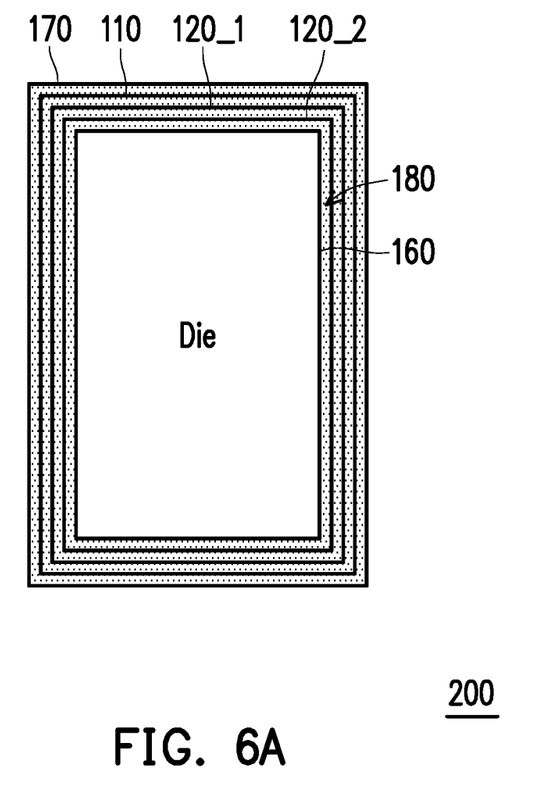
FIG. 6A and FIG. 6B illustrate a schematic diagram of a semiconductor die according to another embodiment of the invention.
Figure 6B:
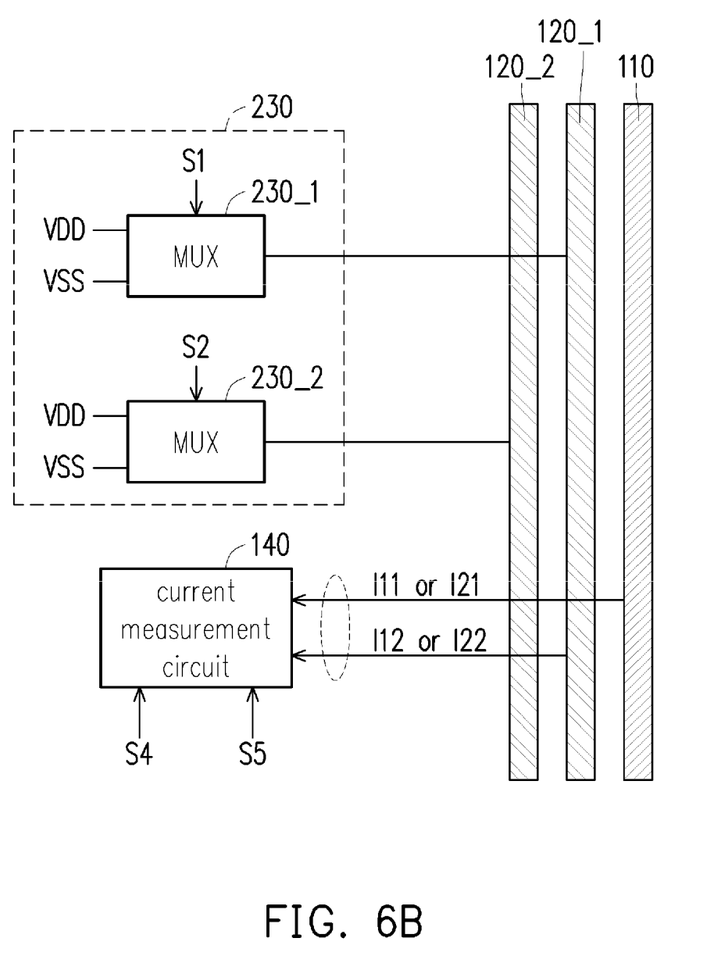

FIG. 6A and FIG. 6B illustrate a schematic diagram of a semiconductor die according to another embodiment of the invention. Referring to FIG. 6A and FIG. 6B, the semiconductor die 200 of the present embodiment includes two edge seal structures 120_1 and 120_2 located at an inner side of the crack stop structure 110, wherein the edge seal structure 120_1 is located between the edge seal structure 120_2 and the crack stop structure 110. The selector circuit 230 includes two multiplexers 230_1 and 230_2 coupled to the edge seal structures 120_1 and 120_2 respectively for voltage selecting between the first voltage VSS and the second voltage VDD. The multiplexers 230_1 and 230_2 are respectively controlled by control signals S1 and S2. The currents on the crack stop structure 110 and the edge seal structures 120_1 are respectively measured by the current measurement circuit 140 to determine whether there is a short among the crack stop structure 110 and the edge seal structure 120_1 or 120_2 and indicate the location of the short during different test phases controlled by the control signals S1 to S2 and control signals S4 to S5. Accordingly, an edge crack and where the edge crack is can be detected.

For example, in case of the crack stop structure 110 being fixedly applied with the first voltage VSS, before a first test phase, a normal mode is performed according to the control signals S1 to S5 at high logical state, such that the multiplexers 230_1 and 230_2 select and output the first voltage VSS to the edge seal structures 120_1 and 120_2. The current measurement circuit 140 measures a first reference current I11 on the crack stop structure 110 according to the control signal S4, and measures a second reference current I12 on the edge seal structure 120_1 according to the control signal S5, and then record them in a register or a latch (not shown).

During a first test phase, whether the edge seal structure 120_1 and the crack stop structure 110 are shorted is tested by the method as described in FIG. 5A or FIG. 5B. Namely, the multiplexer 230_1 selects and outputs the second voltage VDD to the edge seal structure 120_1 in response to the control signals S1 changed to the low logical state. The first voltage VSS is applied to the edge seal structure 120_2 in the first test phase. Thereafter, the current measurement circuit 140 determines whether the crack stop structure 110 and the edge seal structure 120_1 are shorted according to a comparison result of the first test current I21 and the first reference current I11 on the crack stop structure 110. In particular, when the first test current I21 is larger than the first reference current I11, the current measurement circuit 140 will output a value for indicating there is a crack in the in the periphery region 180 of the semiconductor die 100, and indicating that the crack stop structure 110 and the edge seal structure 120_1 are shorted. Namely, the value indicates that the location of the crack is between the crack stop structure 110 and the edge seal structure 120_1. When the first test current I21 is less than or equals to the first reference current I11, the current measurement circuit 140 will output a value for indicating the crack stop structure 110 and the edge seal structure 120_1 are not shorted. Namely, there is no edge crack between the crack stop structure 110 and the edge seal structure 120_1.

During a second test phase, whether the crack stop structure 110 and the edge seal structure 120_2 are shorted is also tested by the method as described in FIG. 5A or FIG. 5B. Namely, the multiplexer 230_2 selects and outputs the second voltage VDD to the edge seal structure 120_2 in response to the control signals S2 changed to the low logical state. The first voltage VSS is applied to the edge seal structure 120_1 in the second test phase. Thereafter, the current measurement circuit 140 determines whether the crack stop structure 110 and the edge seal structure 120_2 are shorted according to a comparison result of the first test current I21 and the first reference current I11 on the crack stop structure 110. In particular, when the first test current I21 and is larger than the first reference current I11, the current measurement circuit 140 will output a value for indicating there is a crack in the in the periphery region 180 of the semiconductor die 100, and indicating that the crack stop structure 110 and the edge seal structure 120_2 are shorted. Namely, the value indicates that the location of the crack is between the crack stop structure 110 and the edge seal structure 120_2. When the first test current I21 and is less than or equals to the first reference current I11, the current measurement circuit 140 will output a value for indicating the crack stop structure 110 and the edge seal structure 120_2 are not shorted. Namely, there is no edge crack between the crack stop structure 110 and the edge seal structure 120_2.

During a third test phase, whether the edge seal structure 120_1 and the edge seal structure 120_2 are shorted is also tested by the method as described in FIG. 5A or FIG. 5B. Namely, the multiplexer 230_2 selects and outputs the second voltage VDD to the edge seal structures 120_2 in response to the control signals S2 changed to the low logical state. The first voltage VSS is applied to the edge seal structure 120_1 in the third test phase. Thereafter, the current measurement circuit 140 determines whether the edge seal structure 120_1 and the edge seal structure 120_2 are shorted according to a comparison result of the second test current I22 and the second reference current I12 on the edge seal structure 120_1. In particular, when the second test current I22 and is larger than the second reference current I12, the current measurement circuit 140 will output a value for indicating there is a crack in the in the periphery region 180 of the semiconductor die 100, and indicating that the edge seal structure 120_1 and the edge seal structure 120_2 are shorted. Namely, the value indicates that the location of the crack is between the edge seal structure 120_1 and the edge seal structure 120_2. When the second test current I22 and is less than or equals to the second reference current I12, the current measurement circuit 140 will output a value for indicating the edge seal structure 120_1 and the edge seal structure 120_2 are not shorted. Namely, there is no edge crack between the edge seal structure 120_1 and the edge seal structure 120_2.

In another embodiment, during the third test phase, for testing the connection between the edge seal structure 120_1 and the edge seal structure 120_2 by the method as described in FIG. 5A or FIG. 5B, the multiplexer 230_1 may select and output the second voltage VDD to the edge seal structures 120_1 in response to the control signals S1 changed to the low logical state. The first voltage VSS is applied to the edge seal structure 120_2 in the third test phase. Thereafter, the current measurement circuit 140 determines whether the edge seal structure 120_1 and the edge seal structure 120_2 are shorted according to a comparison result of the test current and the reference current on the edge seal structure 120_2. In particular, when the test current and is larger than the reference current, the current measurement circuit 140 will output a value for indicating there is a crack in the in the periphery region 180 of the semiconductor die 100, and indicating that the edge seal structure 120_1 and the edge seal structure 120_2 are shorted. When the test current and is less than or equals to the reference current, the current measurement circuit 140 will output a value for indicating the edge seal structure 120_1 and the edge seal structure 120_2 are not shorted.

Therefore, in the present embodiment, the crack stop structure 110, the edge seal structure 120_1 and the edge seal structure 120_2 can be sequentially selected to be tested two by two until all of the connection (i.e. short-circuit) tests therebetween are completed. In addition, the operation of the semiconductor die 200 described in the embodiment of the invention is sufficiently taught, suggested, and embodied in the embodiments illustrated in FIG. 1A to FIG. 5B, and therefore no further description is provided herein.

Figure 7A:
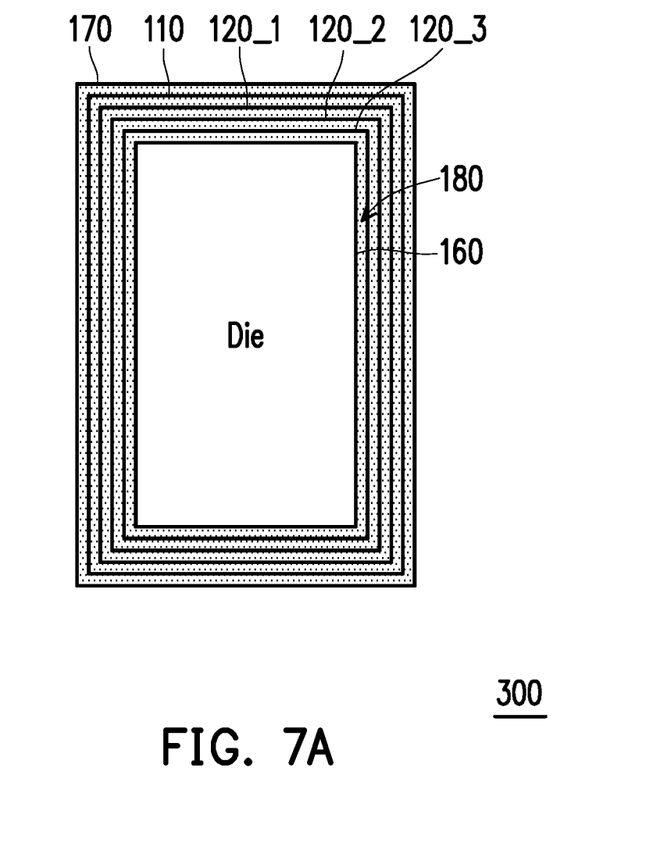
FIG. 7A and FIG. 7B illustrate a schematic diagram of a semiconductor die according to another embodiment of the invention.
Figure 7B:
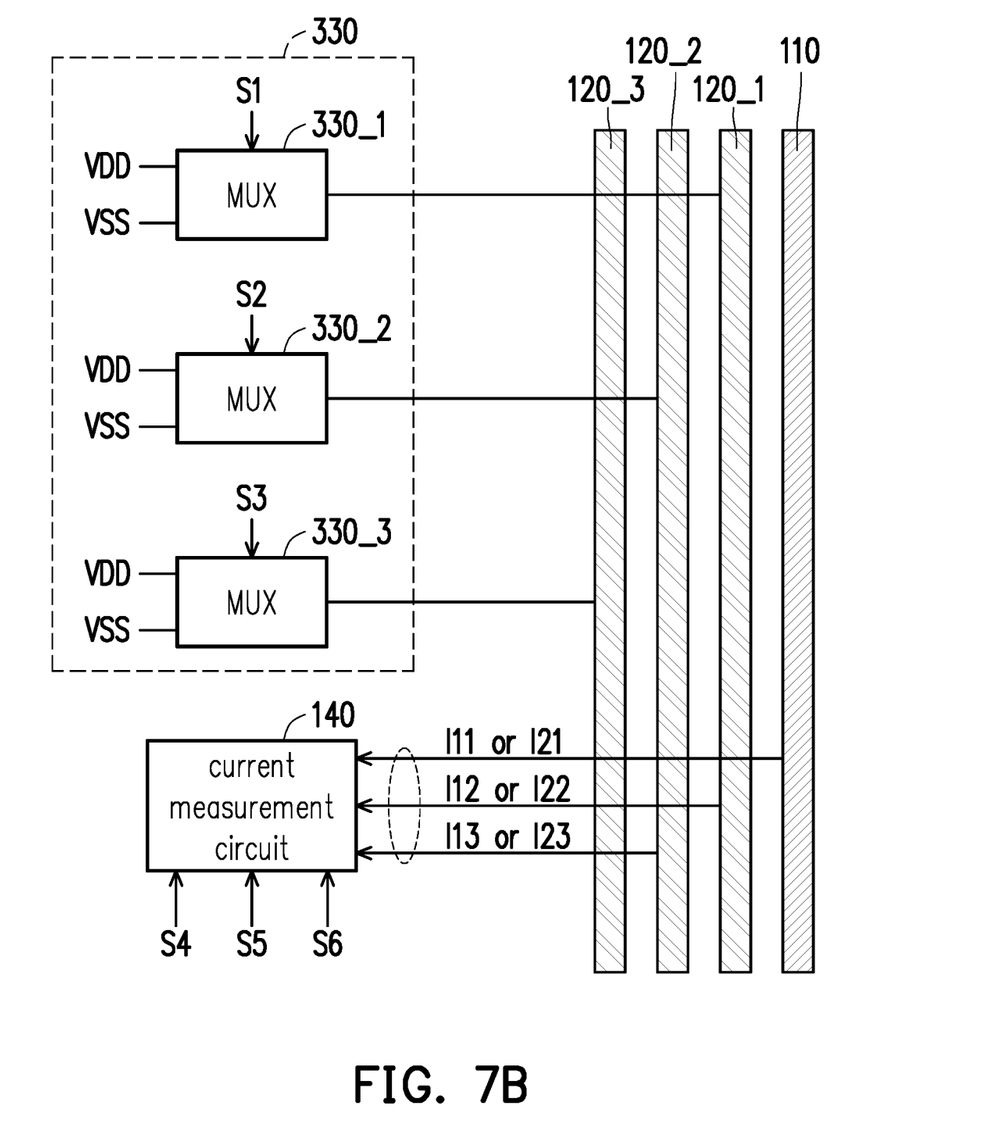

FIG. 7A and FIG. 7B illustrate a schematic diagram of a semiconductor die according to another embodiment of the invention. In FIG. 7A and FIG. 7B, elements that are the same as those in FIG. 6A and FIG. 6B are denoted by the same reference numerals. In order to simplify the description, the elements the same as those shown in FIG. 6A and FIG. 6B and the steps of detecting an edge crack in a semiconductor die 100 are not described in detail herein. Referring to FIG. 7A and FIG. 7B, the semiconductor die 200 of the present embodiment includes three edge seal structures 120_1, 120_2 and 120_3 located at an inner side of the crack stop structure 110, the edge seal structure 120_2 is located between the edge seal structure 120_1 and the edge seal structure 120_3. The selector circuit 330 includes three multiplexers 330_1, 330_2 and 330_3 for voltage selecting. The multiplexers 330_1, 330_2 and 330_3 are respectively controlled by control signals S1, S2 and S3. The currents on the crack stop structure 110 and the edge seal structures 120_1, 120_2 are respectively measured by the current measurement circuit 140 by the method as described in FIG. 5A or FIG. 5B to determine whether there is a short among the crack stop structure 110 and the edge seal structure 120_1, 120_2 or 120_3 and indicate the location of the short during different test phases controlled by the control signals S1 to S5. Accordingly, an edge crack and where the edge crack is can be detected. The operation of the semiconductor die 300 described in the embodiment of the invention is sufficiently taught, suggested, and embodied in the embodiments illustrated in FIG. 1A to FIG. 6B, and therefore no further description is provided herein.

In summary, in the embodiments of the invention, chip edge crack detecting scheme is provided in memory devices. After package is made, bridge or short between the crack stop structure and the edge seal structure(s) can be detected by the proposed method. A controllable biasing scheme is performed for the crack stop structure and the edge seal structure. Therefore, the chip edge crack can be effectively detected.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A semiconductor die, comprising:
a crack stop structure located in a periphery region of the semiconductor die, wherein the crack stop structure is biased by a first voltage;
at least one edge seal structure located between the crack stop structure and an integrated circuit region of the semiconductor die, wherein the at least one edge seal structure is biased by the first voltage in a normal mode and is biased by a second voltage different from the first voltage in a test mode; and a selector circuit coupled to the at least one edge seal structure and configured to receive the first voltage, the second voltage and a control signal for placing the semiconductor die in the normal mode or the test mode, and select and output one of the first voltage and the second voltage to the at least one edge seal structure according to the control signal, wherein when a first test current flows from the edge seal structure to the crack stop structure in the test mode, it means there is a crack between the edge seal structure and the crack stop structure.

2. The semiconductor die of claim 1, further comprising:
a current measurement circuit coupled to the crack stop structure,
wherein the current measurement circuit is configured to receive the first test current in the test mode and receive a first reference current in the normal mode from the crack stop structure, compare the first test current to the first reference current for generating a first comparison result, and determine whether there is a crack in the periphery region according to the first comparison result.

3. The semiconductor die of claim 2, wherein
when the first test current is larger than the first reference current, the current measurement circuit determines there is a crack in the periphery region and outputs a value for indicating fail; and
when the first test current is not larger than the first reference current, the current measurement circuit determines that there are no cracks in the periphery region and outputs a value for indicating pass.

4. The semiconductor die of claim 1, wherein the crack stop structure is coupled to a tester in the test mode,
wherein the tester is configured to receive the first test current from the crack stop structure in the test mode, compare the first test current to a first reference current stored in the tester for generating a first comparison result, and determine whether there is a crack in the periphery region according to the first comparison result.

5. The semiconductor die of claim 4, wherein
when the first test current is larger than the first reference current, the tester determines that there is a crack in the periphery region and outputs a value for indicating fail; and
when the first test current is not larger than the first reference current, the tester determines that there are no cracks in the periphery region and outputs a value for indicating pass.

6. The semiconductor die of claim 4, wherein the first reference current is measured by the tester in a normal mode.

7. The semiconductor die of claim 1, wherein the second voltage is larger than the first voltage.

8. The semiconductor die of claim 1, further comprising:
a current measurement circuit coupled to the first edge seal structure,
wherein the at least one edge seal structure comprises a first edge seal structure and a second edge seal structure, and the selector circuit is configured to select and output the first voltage to the first edge seal structure and select and output the second voltage to the second edge seal structure in the test mode,
wherein the current measurement circuit is configured to receive a second test current in the test mode and receive a second reference current in the normal mode from the first edge seal structure, compare the second test current to the second reference current for generating a second comparison result, and determine whether there is a crack between the first edge seal structure and the second edge seal structure according to the second comparison result.

9. The semiconductor die of claim 2, wherein the at least one edge seal structures comprise a first edge seal structure and a second edge seal structure, and the selector circuit is configured to select and output the first voltage to the first edge seal structure and select and output the second voltage to the second edge seal structure in the test mode,
wherein the test mode includes a first test phase and a second test phase, the current measurement circuit is configured to receive a first reference current from the crack stop structure and a second reference current from the first edge seal structure in the normal mode,
wherein the current measurement circuit is configured to receive a first test current from the crack stop structure in the first test phase, compare the first test current to the first reference current for generating a first comparison result, and determine whether there is a crack between the crack stop structure and the first edge seal structure according to the first comparison result,
wherein the current measurement circuit is configured to receive a second test current from the first edge seal structure in the second test phase, compare the second test current to the second reference current for generating a second comparison result, and determine whether there is a crack between the first edge seal structure and the second edge seal structure according to the second comparison result.

10. A method for detecting an edge crack in a semiconductor die, wherein the semiconductor die comprises a crack stop structure located in a periphery region of the semiconductor die and biased by a first voltage and at least one edge seal structure located between the crack stop structure and an integrated circuit region of the semiconductor die, the method comprising:
receiving a first voltage, a second voltage and a control signal for placing the semiconductor die in a normal mode or a test mode, wherein the second voltage is different from the first voltage;
outputting the first voltage to the at least one edge seal structure in the normal mode, and receiving a reference current from the crack stop structure or the at least one edge seal structure;
outputting the second voltage to the at least one edge seal structure in the test mode, and receiving a test current from the crack stop structure or the at least one edge seal structure;
comparing the test current to the reference current for generating a comparison result; and
determining whether here is a crack in the periphery region according to the comparison result,
wherein the crack stop structure is biased by the first voltage in the test mode and the normal mode,
wherein the test current includes a first test current provided by the crack stop structure, and when the first test current flows from the edge seal structure to the crack stop structure in the test mode, it means there is a crack between the edge seal structure and the crack stop structure.

11. The method for detecting the edge crack in the semiconductor die of claim 10, wherein the step of determining whether there is a crack in the periphery region according to the comparison result comprises:

when the test current is larger than the reference current, determining there is a crack in the periphery region and outputs a value for indicating fail; and when the test current is not larger than the reference current, determining that there are no cracks in the periphery region and outputs a value for indicating pass.

12. The method for detecting the edge crack in the semiconductor die of claim 10, wherein the second voltage is larger than or smaller than the first voltage.

13. The method for detecting the edge crack in the semiconductor die of claim 10, wherein the at least one edge seal structure comprises a first edge seal structure and a second edge seal structure, wherein receiving the reference current from the crack stop structure or the at least one edge seal structure includes receiving the reference current from the first edge seal structure, wherein outputting the second voltage to the at least one edge seal structure in the test mode includes selecting and outputting the first voltage to the first edge seal structure and selecting and outputting the second voltage to the second edge seal structure in the test mode, wherein the method further comprises:

when the test current is larger than the reference current, outputting a value for indicating there is a crack between the first edge seal structure and the second edge seal structure.

14. The method for detecting the edge crack in the semiconductor die of claim 10, wherein the at least one edge seal structures comprise a first edge seal structure and a second edge seal structure, wherein receiving the reference current from the crack stop structure or the at least one edge seal structure includes receiving a first reference current from the crack stop structure and receiving a second reference current from the first edge seal structure, wherein outputting the second voltage to the at least one edge seal structure in the test mode includes selecting and outputting the first voltage to the first edge seal structure and selecting and outputting the second voltage to the second edge seal structure in the test mode, wherein receiving the test current from the crack stop structure or the at least one edge seal structure includes receiving the first test current from the crack stop structure in a first test phase of the test mode and receiving a second test current from the first edge seal structure in a second test phase of the test mode, wherein comparing the test current to the reference current for generating the comparison result includes comparing the first test current to the first reference current for generating a first comparison result and comparing the second test current to the second reference current for generating a second comparison result, wherein the method further comprises:

when the first test current is larger than the first reference current, outputting a first value for indicating there is a crack between the crack stop structure and the first edge seal structure, and when the second test current is larger than the second reference current, outputting a second value for indicating there is a crack between the first edge seal structure and the second edge seal structure.

* * * * *